US011736082B2

(12) United States Patent
Takida (10) Patent No.: US 11,736,082 B2
(45) Date of Patent: Aug. 22, 2023

(54) CLIPPING STATE DETECTING CIRCUIT AND CLIPPING STATE DETECTING METHOD

(71) Applicants: KABUSHIKI KAISHA TOSHIBA, Tokyo (JP); TOSHIBA ELECTRONIC DEVICES & STORAGE CORPORATION, Tokyo (JP)

(72) Inventor: Takayuki Takida, Tokyo (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 30 days.

(21) Appl. No.: 17/410,407

(22) Filed: Aug. 24, 2021

(65) Prior Publication Data

US 2022/0085783 A1 Mar. 17, 2022

(30) Foreign Application Priority Data

Sep. 11, 2020 (JP) .................................. 2020-153062

(51) Int. Cl.
| H03F 3/217 | (2006.01) |
| H03G 3/20 | (2006.01) |
| H03G 11/00 | (2006.01) |
| H03F 1/52 | (2006.01) |
| H03G 3/30 | (2006.01) |

(52) U.S. Cl.
CPC ............ *H03G 11/00* (2013.01); *H03F 1/523* (2013.01); *H03F 3/217* (2013.01); *H03G 3/3021* (2013.01); *H03F 2200/351* (2013.01); *H03F 2200/66* (2013.01)

(58) Field of Classification Search
CPC .... H03G 11/00; H03G 3/3021; H03G 11/008; H03F 1/523; H03F 3/217; H03F 2200/351; H03F 2200/66; H03F 2200/03; H03F 1/32; H03F 3/181; H03F 3/2171; H03F 3/2173
USPC ........................................ 330/10, 207 A, 251
See application file for complete search history.

(56) References Cited

U.S. PATENT DOCUMENTS

| 7,778,324 | B2 | 8/2010 | Stanley | |
| 10,079,578 | B2* | 9/2018 | Qian | H03F 1/26 |
| 10,298,188 | B2 | 5/2019 | Kiyono | |
| 10,447,217 | B2* | 10/2019 | Zhao | H03F 3/217 |
| 10,903,744 | B2* | 1/2021 | Takida | H02M 1/32 |
| 2014/0125411 | A1* | 5/2014 | Holzmann | H03F 3/2173 330/251 |
| 2019/0074798 | A1* | 3/2019 | Goto | G10K 11/36 |

FOREIGN PATENT DOCUMENTS

| JP | 2007-143148 A | 6/2007 |
| JP | 2009-239504 A | 10/2009 |
| JP | 2018-137576 A | 8/2018 |

\* cited by examiner

*Primary Examiner* — Khanh V Nguyen
(74) *Attorney, Agent, or Firm* — Allen & Overy LLP (57) ABSTRACT

According to one embodiment, a clipping state detecting circuit includes: a zero-cross detection circuit that detects a zero-cross point of an input signal; an output circuit that converts the input signal into a PWM signal; a clip detection circuit that detects a state in which an output of the output circuit is clipped; and a control circuit that determines a state is a clipping state when a clip time of the output of the output circuit satisfies a condition of a threshold value set in advance with respect to a non-clip time.

20 Claims, 7 Drawing Sheets

CLIPPING STATE DETECTING CIRCUIT AND CLIPPING STATE DETECTING METHOD

CROSS-REFERENCE TO RELATED APPLICATIONS

This application is based upon and claims the benefit of priority from Japanese Patent Application No. 2020-153062, filed on Sep. 11, 2020; the entire contents of which are incorporated herein by reference.

FIELD

Embodiments described herein relate generally to a clipping state detecting circuit and a clipping state detecting method.

BACKGROUND

Conventionally, a technique of an amplifier circuit that converts an input signal into a pulse width modulation (PWM) signal and amplifies the input signal has been disclosed. In such an amplifier circuit, when the level of the input signal is too high, a peak value or a bottom value of an output signal sticks to a fixed value, that is, a so-called clipping state is caused. In the clipping state, distortion occurs the output signal.

An attempt has been made to determine that a state is the clipping state when the clipping state continues for a certain period of time or more. In the case of determining the clipping state in this manner, clip determination is performed at a low distortion ratio when a frequency of the input signal is low, but the clip determination is performed at a high distortion ratio when the frequency of the input signal is high. That is, frequency dependence occurs in the clip determination, and a threshold value of the clip determination varies. In addition, it is necessary to wait for time for the clip determination to elapse. A clipping state detecting circuit and a clipping state detecting method capable of quickly performing clip determination that does not depend on a frequency of an input signal are desired.

DETAILED DESCRIPTION

According to one embodiment, a clipping state detecting circuit includes: a zero-cross detection circuit that detects a zero-cross point of an input signal and outputs a zero-cross signal; an output circuit that converts the input signal into a pulse width modulation (PWM) signal and outputs the PWM signal; a clip detection circuit that detects a state in which an output of the output circuit is clipped and outputs a clip detection signal; and a control circuit that determines that a state is a clipping state when a clip time in which the output of the output circuit is clipped satisfies a condition of a threshold value set in advance with respect to a non-clip time from a point in time at which the zero-cross signal is output to a point in time at which the clip detection signal is output.

Hereinafter, a clipping state detecting circuit and a clipping state detecting method according to embodiments be described in detail with reference to the accompanying drawings. The present invention is not limited to the following embodiments.

First Embodiment

Figure 1:
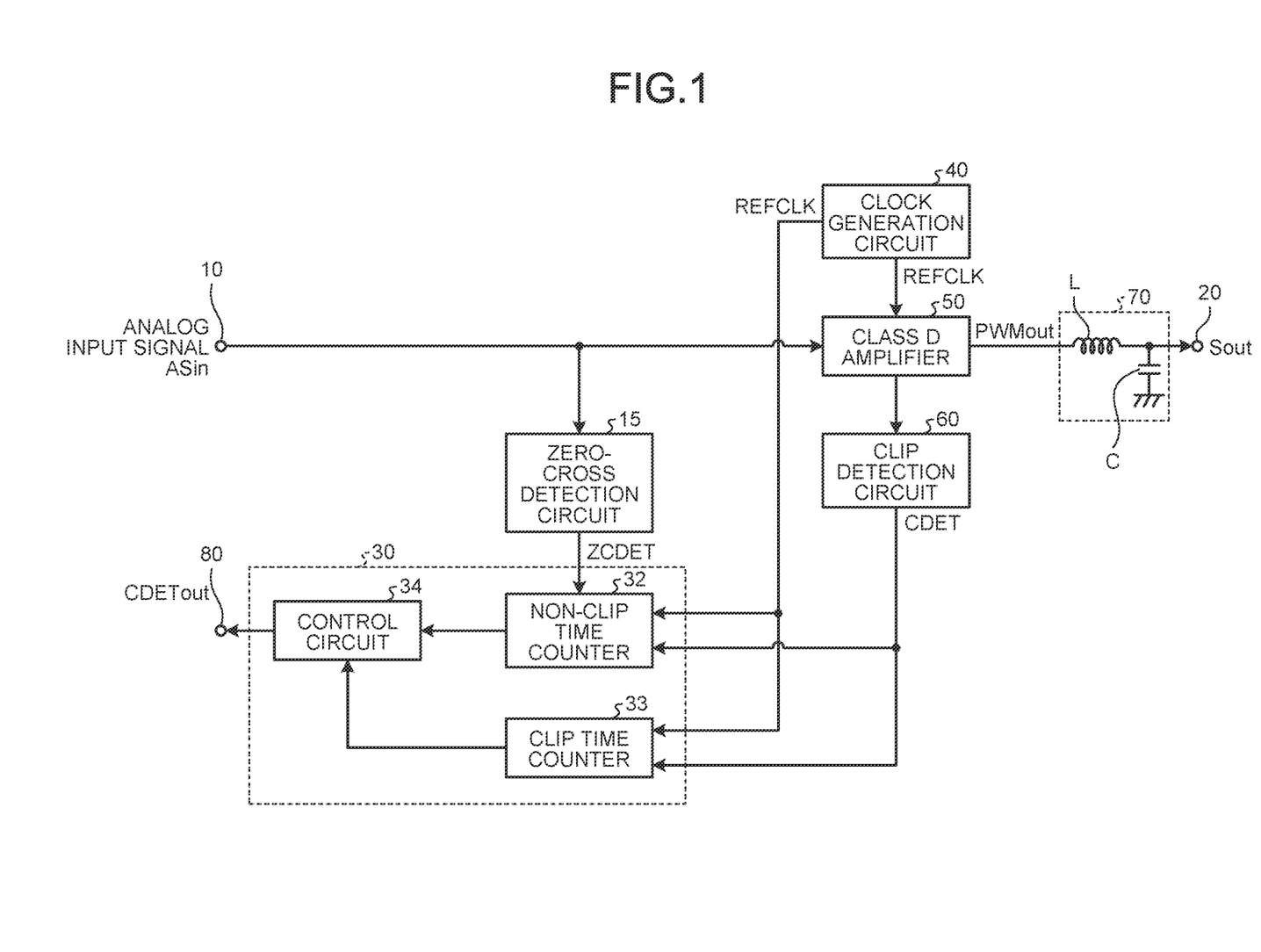
FIG. 1 is a diagram illustrating a configuration of a clipping state detecting circuit according to a first embodiment.

FIG. 1 is a diagram illustrating a configuration of a clipping state detecting circuit according to a first embodiment. The clipping state detecting circuit of the present embodiment includes a zero-cross detection circuit 15, a logic circuit unit 30, a class D amplifier 50, and a clip detection circuit 60. The logic circuit unit 30 includes a non-clip time counter 32, a clip time counter 33, and a control circuit 34.

The zero-cross detection circuit 15 detects a zero-cross point of an analog input signal ASin supplied to an input terminal 10. The input signal ASin is, for example, an audio signal. Specifically, the zero-cross detection circuit 15 detects a zero-cross point at which the input signal ASin changes up and down around a reference level, and outputs an H-level zero-cross detection signal ZCDET. For example, the zero-cross detection circuit 15 includes a comparison circuit (not illustrated) that compares the input signal ASin with a predetermined reference level, and a signal generation circuit (not illustrated) that outputs the zero-cross detection signal ZCDET when an output of the comparison circuit is inverted. Note that FIG. 1 illustrates a case where the input signal ASin has a single phase. In a case where the input signal ASin is a differential input signal, a zero-cross point can be detected by a configuration in which a comparison circuit in which a differential input signal is supplied to an inverting input terminal and a non-inverting input terminal is provided.

The input signal ASin is supplied to the class D amplifier 50. The class D amplifier 50 generates a sawtooth wave (not illustrated) in response to a reference clock signal REFCLK supplied from a clock generation circuit 40. The class D amplifier 50 generates and outputs a PWM output signal PWMout in response to the sawtooth wave and the input signal ASin.

The PWM output signal PWMout is supplied to a filter circuit 70. The filter circuit 70 includes an inductor L and a capacitor C. The filter circuit 70 supplies, to an output terminal 20, an output signal Sout whose amplitude changes according to on-duty of the PWM output signal PWMout. The output terminal 20 is connected to, for example, a speaker (not illustrated).

When amplitude of the input signal ASin becomes larger than amplitude of the generated sawtooth wave, the PWM output signal PWMout is fixed to an H level or an L level and enters a clipping state. The clip detection circuit 60 detects that the PWM output signal PWMout is in a clipping state and outputs a clip detection signal CDET.

The zero-cross detection signal ZCDET is supplied to the non-clip time counter 32. The non-clip time counter 32 counts by the reference clock signal REFCLK from supply of the zero-cross detection signal ZCDET to supply of the clip detection signal CDET, and measures a non-clip time NCCNT.

The clip time counter 33 measures a clip time CCNT by counting by the reference clock signal REFCLK while the clip detection circuit 60 outputs the clip detection signal CDET.

When the clip time CCNT satisfies a threshold value condition, the control circuit 34 determines that the state is the clipping state and outputs a clip determination signal CDETout from a detection output terminal 80. The threshold value condition is set by a ratio between the clip time CCNT and the non-clip time NCCNT. By performing the clip determination not by duration of the clip time CCNT but by a clip determination threshold value CLIP_TH based on the ratio between the clip time CCNT and the non-clip time NCCNT, it is possible to perform the clip determination independent of a frequency of the input signal. How to set the threshold value will be described later.

Note that the reference clock signals supplied to the non-clip time counter 32 and the clip time counter 33 may be prepared separately from the reference clock signal supplied to the class D amplifier 50. For example, frequencies of the reference clock signals supplied to the non-clip time counter 32 and the clip time counter 33 are set higher than the frequency of the reference clock signal supplied to the class D amplifier 50. As a result, since the number of counts within the same time by the non-clip time counter 32 and the clip time counter 33 increases, measurement accuracy of the clip time CCNT and the non-clip time NCCNT can be improved.

Figure 2:
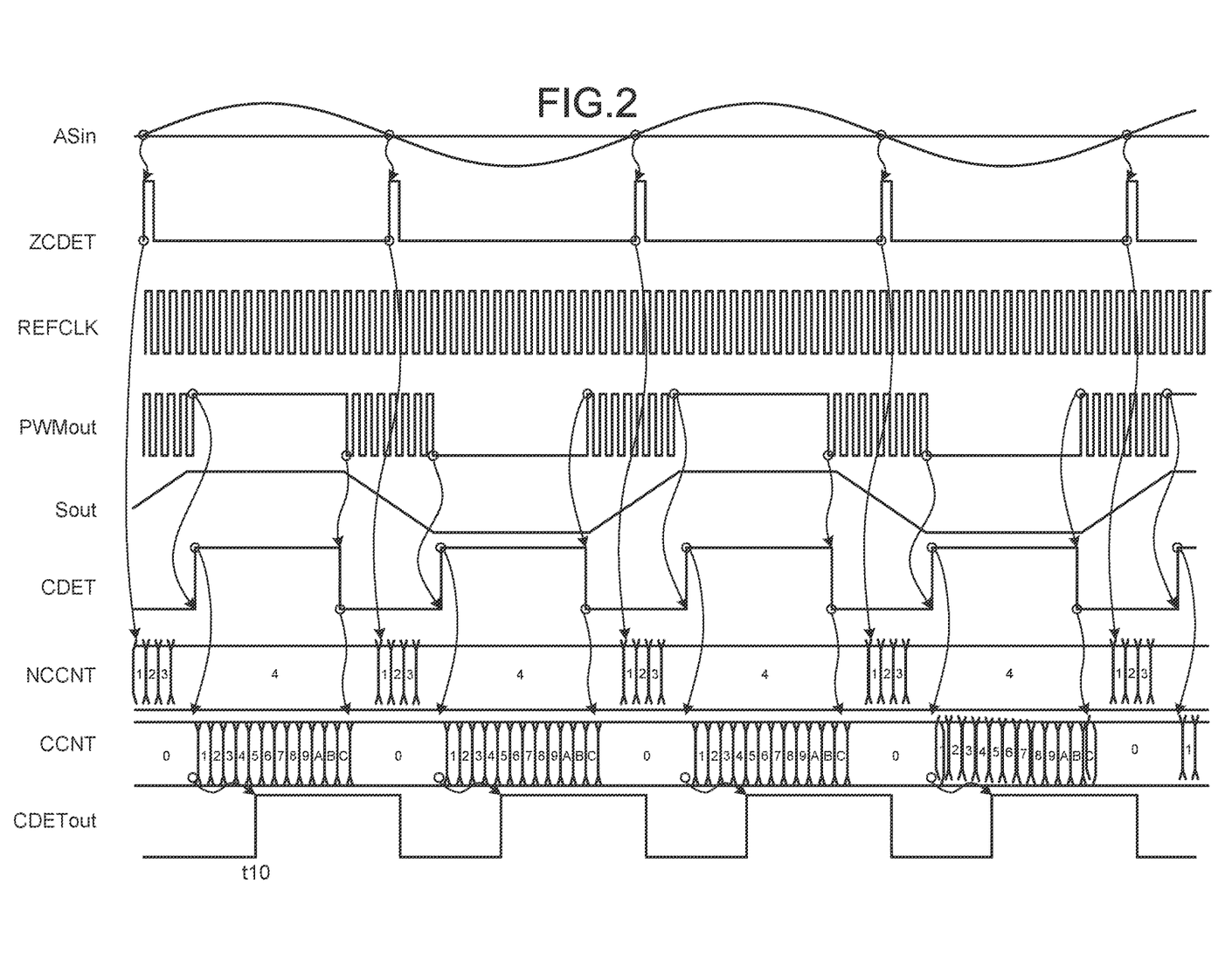
FIG. 2 is a timing chart for explaining an operation of the clipping state detecting circuit according to the first embodiment.

FIG. 2 is a timing chart for explaining an operation of the clipping state detecting circuit according to the first embodiment. The top row indicates the input signal ASin. The next row indicates the zero-cross detection signal ZCDET. The next row indicates the reference clock signal REFCLK. The reference clock signal REFCLK is supplied to the class D amplifier 50, the non-clip time counter 32, and the clip time counter 33. The next row indicates the PWM output signal PWMout. The on-duty of the PWM output signal PWMout changes according to the amplitude of the input signal ASin. The next row indicates the output signal Sout. The output signal Sout is a signal generated by filtering the PWM output signal PWMout by the filter circuit 70.

The next row indicates the clip detection signal CDET. The next row indicates how the non-clip time NCCNT is measured. The non-clip time counter 32 counts up to a rise of the clip detection signal CDET in response to the zero-cross detection signal ZCDET. The illustrated example illustrates a state in which the reference clock signal REFCLK is counted up to "4" and the count number "4" is held.

The next row indicates how the clip time CCNT is measured. In response to the rise of the clip detection signal CDET, the clip time counter 33 counts up to a fall of the clip detection signal CDET. The illustrated example illustrates a state in which the reference clock signal REFCLK is counted up to "C".

The bottom row indicates the clip determination signal CDETout. The illustrated example illustrates a state in which the clip determination signal CDETout is output at a timing t10 when the clip time CCNT satisfies a threshold value relationship. The clip determination signal CDETout maintains the H level in a period corresponding to a period in which the clip detection signal CDET is at the H level. Note that, since the clip determination signal CDETout is an output signal that notifies a result of determination as clipping, the period of the H level may not be the same as the period of the H level of the clip detection signal CDET.

Figure 3:
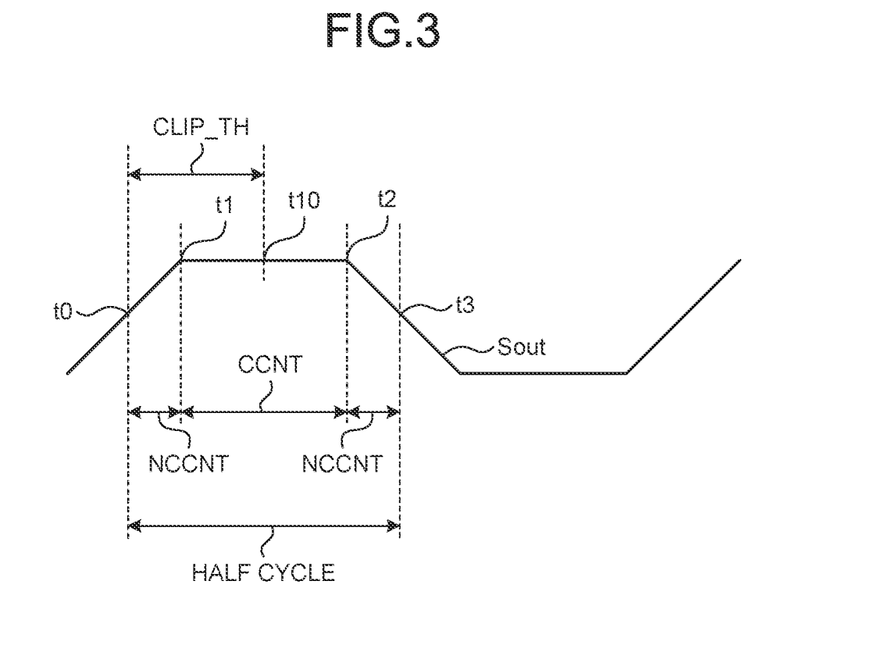
FIG. 3 is a diagram for explaining a threshold value setting method.

FIG. 3 is a diagram for explaining a threshold value setting method. FIG. 3 illustrates, regarding the output signal Sout, timings t0 and t3 of the zero-cross point, a timing t1 at which a state becomes the clipping state, and a timing t2 at which the clipping state is released. The timing t10 is a timing at which the control circuit 34 determines that clipping is occurring and outputs the clip determination signal CDETout.

A half cycle of the output signal Sout is set assuming a time that is twice the non-clip time NCCNT and a time obtained by adding the clip time CCNT. Using the set half cycle of the output signal Sout, an index α represented by the following Formula (1) expressed by the non-clip time NCCNT and the clip time CCNT is set. The same applies to a negative half cycle.

[Formula 1]
$$\alpha = \frac{CCNT}{NCCNT \times 2 + CCNT} \quad (1)$$

Formula (1) indicates a ratio of the half cycle of the output signal Sout to the clip time CCNT. The clip time CCNT causes distortion in the output signal Sout. Therefore, it is possible to arbitrarily set the index α by associating a target distortion ratio with the index α expressed by Formula (1).

By converting Formula (1), the following Formula (2) expressed by a ratio of the clip time CCNT to the non-clip time NCCNT is obtained.

[Formula 2]
$$CCNT = \frac{2\alpha}{1-\alpha} \times NCCNT \quad (2)$$

When 2α/1−α expressed by Formula (2) is defined as a clip ratio CLIP_RATIO and a left side is expressed as the clip determination threshold value CLIP_TH, Formula (3) is obtained.

$$CLIP\_TH = CLIP\_RATIO \times NCCNT \quad (3)$$

That is, the clip determination threshold value CLIP_TH is set by the non-clip time NCCNT and the clip ratio CLIP_RATIO. Therefore, by setting the index α in association with the target distortion ratio, the clip ratio CLIP_RATIO can be associated with the distortion redo. Further, the clip determination threshold value CLIP_TH can be set in association with the target distortion ratio.

In the case of an audio signal, total harmonic distortion indicating a degree of distortion of the output signal Sout having no frequency dependency is used as an index indicating performance of the amplifier circuit. Therefore, by associating the clip ratio CLIP_RATIO with a total harmonic distortion ratio, the clip determination threshold value CLIP_TH can be defined as an index for a desired total harmonic distortion ratio.

For example, a conversion table (not illustrated) is provided in which the desired total harmonic distortion ratio and the clip ratio CLIP_RATIO are associated with each other. The control circuit 34 compares data of the conversion table in which association is performed this way with measurement time of the non-clip time NCCNT. The control circuit 34 outputs the clip determination signal CDETout when a measurement value of the clip time counter 33 satisfies a condition of the clip determination threshold value CLIP_TH of Formula (3).

The control circuit 34 determines that clipping is occurring at the timing t10 when the clip time counter 33 reaches the clip time CCNT satisfying the clip determination threshold value CLIP_TH. That is, since clipping is determined when the clip time CCNT satisfies the condition of the clip determination threshold value CLIP_TH, the clip determination can be performed without measuring an entire period of the clip time CCNT. Therefore, the clip determination can be performed quickly.

The clip time CCNT and the non-clip time NCCNT change in the same manner when a frequency of the input signal ASin changes assuming the same distortion ratio. That is, when the non-clip time NCCNT becomes longer, the clip time CCNT also becomes longer. Therefore, by setting the clip determination threshold value CLIP_TH according to a ratio between the clip time CCNT and the non-clip time NCCNT, it is possible to perform the clip determination independent of the frequency of the input signal.

Figure 4:
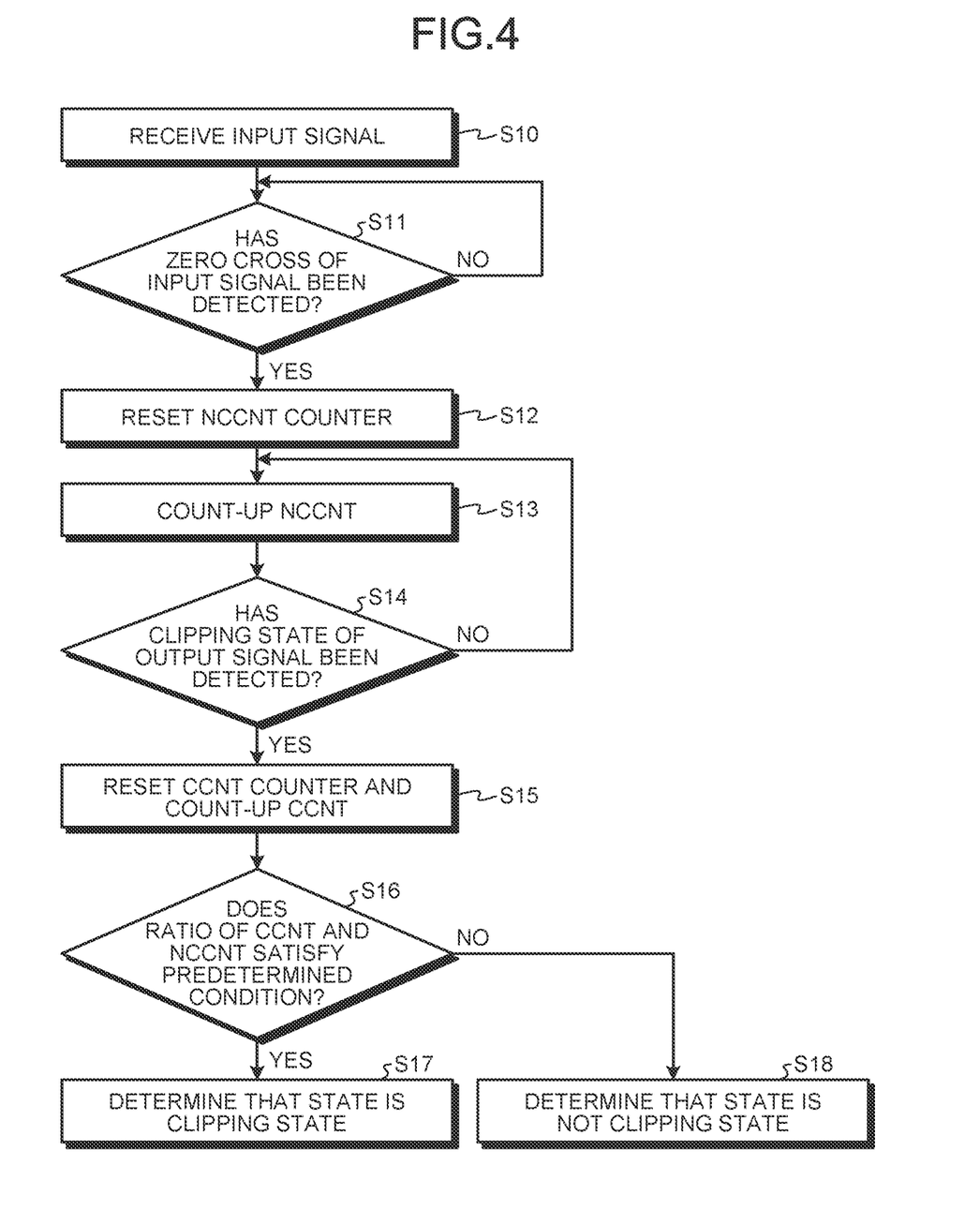
FIG. 4 is a flowchart for explaining a method of clip determination.

FIG. 4 is a flowchart for explaining a method of clip determination. The method is carried out in the clipping state detecting circuit of the first embodiment described above. An input signal is received (S10). The input signal is, for example, an analog signal. When a zero-cross of the input signal is detected (S11: Yes), the counter of the non-clip time NCCNT is reset (S12), and then counting-up is started (S13). When the zero-cross of the input signal is not detected (S11: No), a zero-cross detection operation is continued.

A clipping state of the output signal is detected (S14). When it is detected that the PWM output signal PWMout enters the clipping state (S14: Yes), the counter of the clip time CCNT is reset, and then counting-up is started (S15). When the clipping state of the PWM output signal PWMout is not detected (S14: No), counting of the non-clip time NCCNT is continued until the clipping state is detected.

When the ratio between the clip time CCNT and the non-clip time NCCNT satisfies the condition of the clip determination threshold value CLIP_TH (S16: Yes), it is determined that the state is the clipping state (S17). That is, in a case where the clip time CCNT is equal to or longer than the clip determination threshold value CLIP_TH expressed by Formula (3), it is determined that the state is the clipping state. When the condition of the clip determination threshold value CLIP_TH is not satisfied (S16: No), it is determined that the state is not the clipping state (S18). When the state is determined as the clipping state, the control circuit 34 outputs the clip determination signal CDETout to the detection output terminal 80. In response to the clip determination signal CDETout, an external circuit (not illustrated) connected to the detection output terminal 80 performs control to decrease a signal level of the input signal ASin supplied to the input terminal 10, for example.

Figure 5:
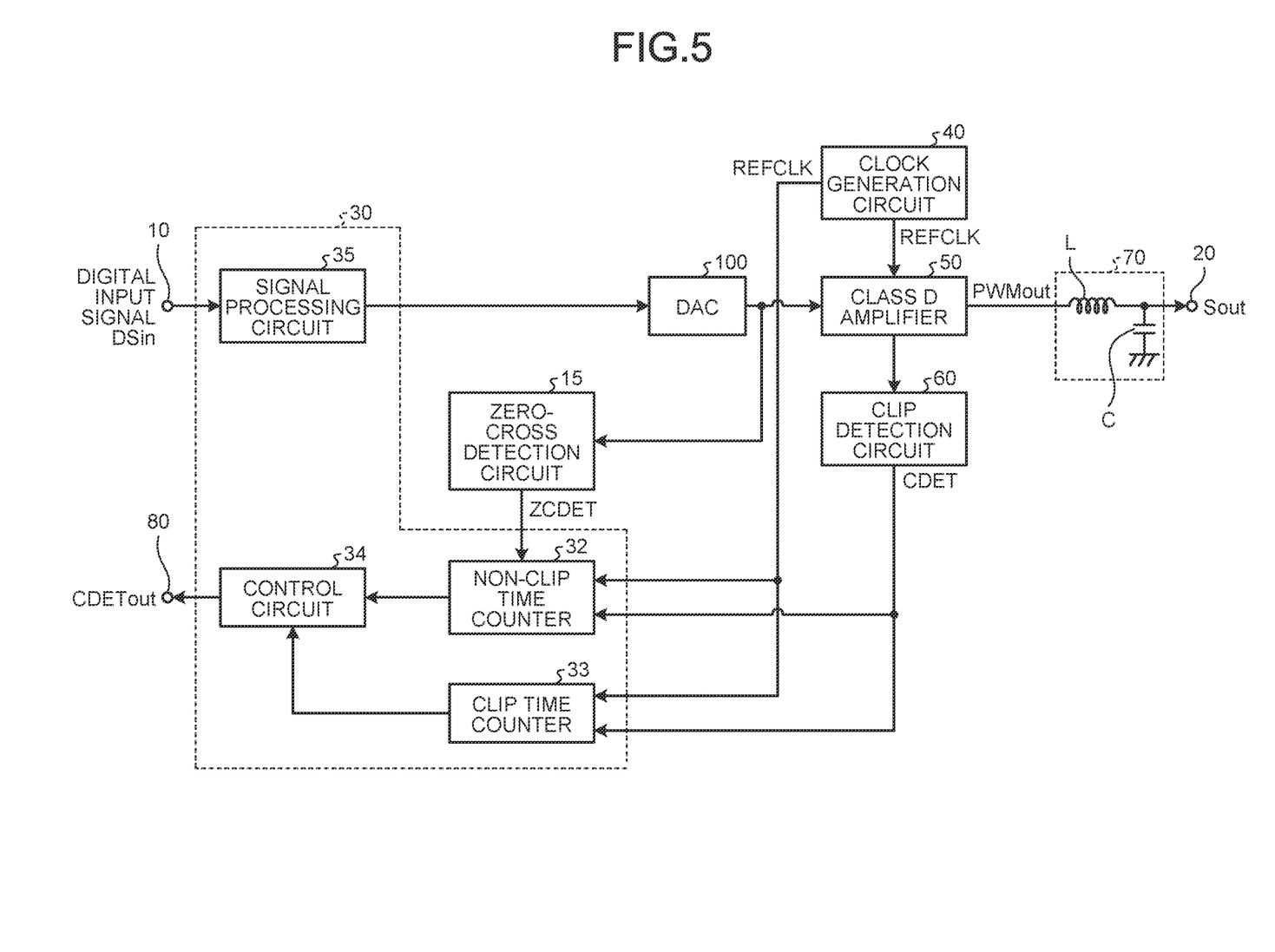
FIG. 5 is a diagram illustrating a clipping state detecting circuit according to a second embodiment.

FIG. 5 is a diagram illustrating a clipping state detecting circuit according to a second embodiment. The configurations corresponding to the first embodiment are denoted by the same reference numerals, and redundant description is made only when necessary. The same applies hereinafter. The clipping state detecting circuit of the present embodiment illustrates an embodiment in a case where a digital input signal DSin is supplied to the input terminal 10. The input signal DSin is, for example, a digital signal expressed by two's complement.

The logic circuit unit 30 further includes a signal processing circuit 35. The signal processing circuit 35 performs predetermined processing on the input signal DSin. For example, the signal processing circuit 35 includes a digital filter circuit (not illustrated).

The output signal of the signal processing circuit 35 is supplied to a DA conversion circuit 100. The DA conversion circuit 100 convert the digital signal output from the signal processing circuit 35 into an analog signal. The analog output signal of the DA conversion circuit 100 is supplied to the zero-cross detection circuit 15 and the class D amplifier 50. When detecting the zero-cross point of the analog output signal, the zero-cross detection circuit 15 supplies the H-level zero-cross detection signal ZCDET to the non-clip time counter 32. The operation of the non-clip time counter 32 after the zero-cross detection signal ZCDET is supplied and the operation of the class D amplifier 50 to which the analog output signal is supplied are similar to those in the first embodiment.

When the digital signal is supplied to the input terminal 10, the digital signal is converted into an analog signal by the DA conversion circuit 100, and a zero-cross point of the analog signal is detected. The non-clip time NCCNT is measured in response to the zero-cross detection, and the clip determination is performed when the clip time CCNT of the PWM output signal PWMout satisfies the condition of the clip determination threshold value CLIP_TH. Since control is performed such that the clip determination is performed by the clip determination threshold value CLIP_TH set by the ratio between the clip time CCNT and the non-clip time NCCNT, it is possible to avoid a situation in which the clip determination is affected by the frequency of the input signal DSin.

Figure 6:
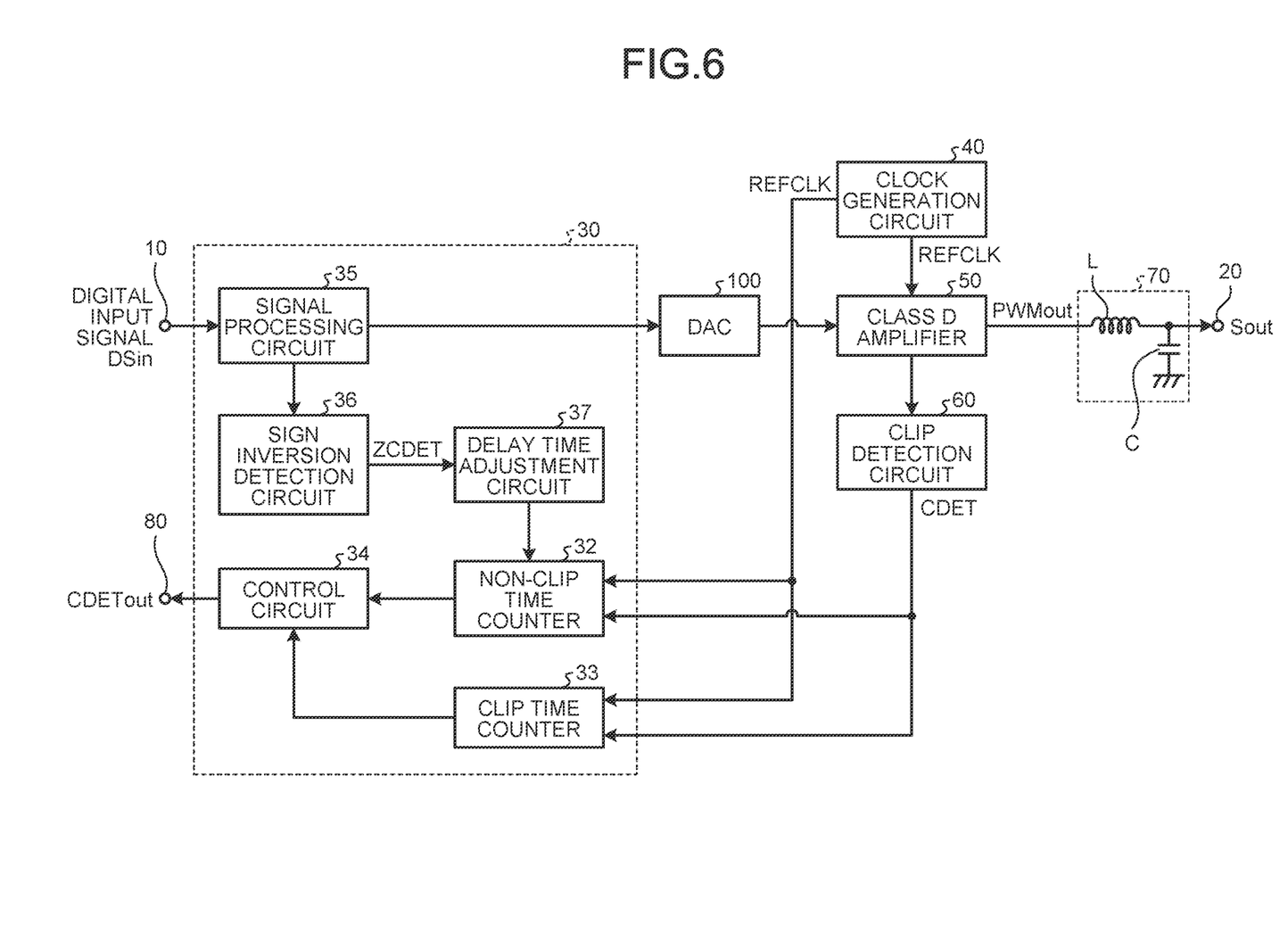
FIG. 6 is a diagram illustrating a configuration of a clipping state detecting circuit according to a third embodiment.

FIG. 6 is a diagram illustrating a configuration of a clipping state detecting circuit according to a third embodiment. The digital input signal DSin is supplied to the input terminal 10. The input signal DSin has, for example, a signal format expressed by two's complement. That is, in the digital input signal DSin, a most significant bit MSB is expressed by "0" or "1" according to a sign.

The logic circuit unit 30 includes a sign inversion detection circuit 36 and a delay time adjustment circuit 37. The sign inversion detection circuit 36 detects inversion of a sign by detecting a sign of the most significant bit MSB of the input signal DSin. The sign inversion of the most significant bit MSB of the input signal DSin corresponds to the zero-cross point of the input signal ASin in the first embodiment. By detecting the sign inversion, it is possible to detect a zero-cross of the input signal DSin.

When detecting the sign inversion of the input signal DSin, the sign inversion detection circuit 36 outputs the H level zero-cross detection signal ZCDET with a short pulse. The zero-cross detection signal ZCDET is supplied to the delay time adjustment circuit 37. The delay time adjustment circuit 37 supplies the zero-cross detection signal ZCDET to the non-clip time counter 32 after a predetermined delay time. It is desired that the clip determination is made at a timing when the PWM output signal PWMout is actually clipped. The delay time adjustment circuit 37 corrects a difference between a timing at which the zero-cross detection signal ZCDET is output and a timing at which the PWM output signal PWMout is output, so that the accuracy of the clip determination can be improved.

Figure 7:
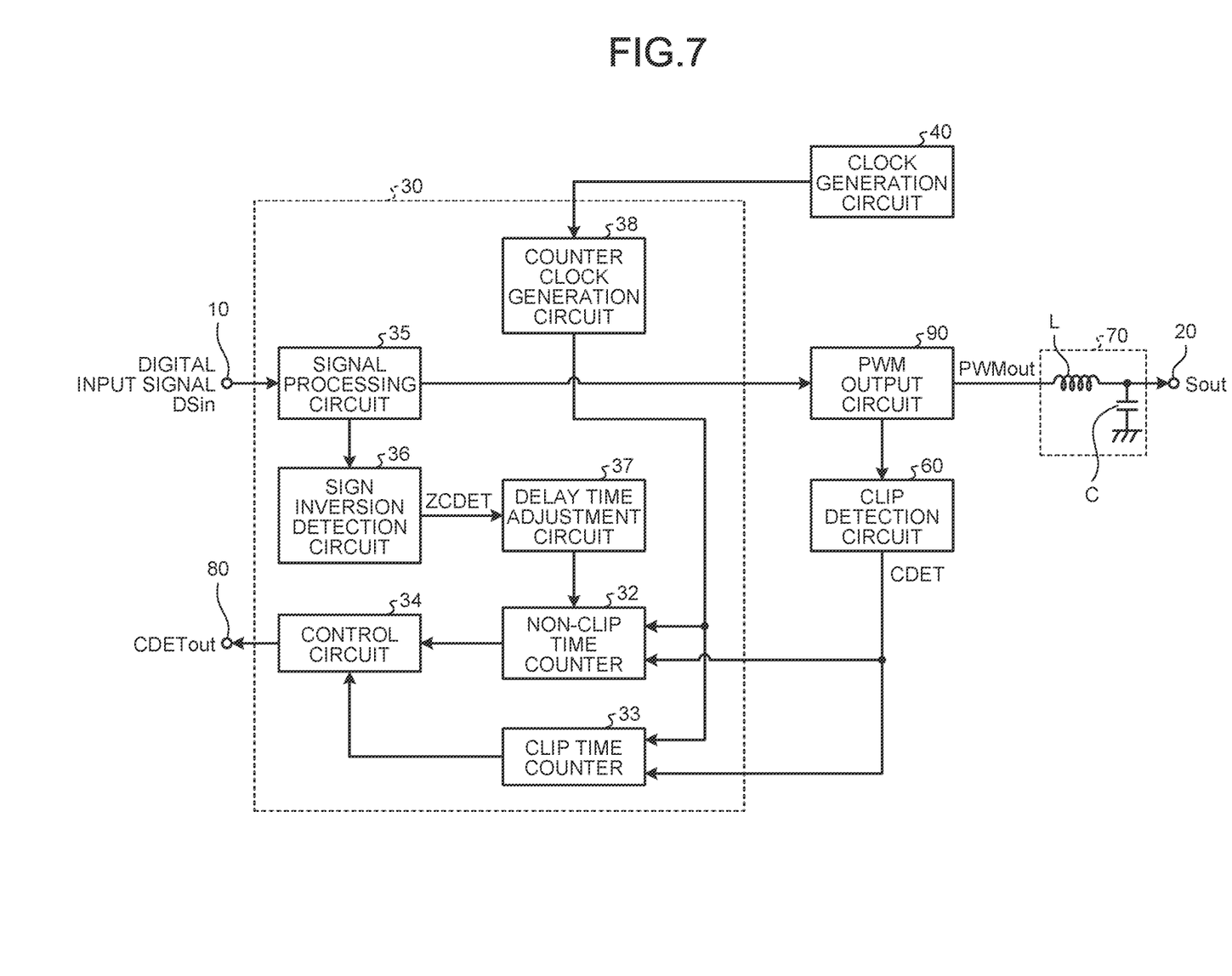
FIG. 7 is a diagram illustrating a configuration of a clipping state detecting circuit according to a fourth embodiment.

FIG. 7 is a diagram illustrating a configuration of a clipping state detecting circuit according to a fourth embodiment. The present embodiment includes a counter clock generation circuit 38 that responds to a clock signal from the clock generation circuit 40. The counter clock generation circuit 38 supplies a clock signal for counting the non-clip time NCCNT and the clip time CCNT to the non-clip time counter 32 and the clip time counter 33. In addition, the present embodiment includes a PWM output circuit 90 to which an output of the signal processing circuit 35 is supplied. The PWM output circuit 90 outputs the PWM output signal PWMout whose on-duty is adjusted according to the digital signal supplied from the signal processing circuit 35. By using the output signal from the signal processing circuit 35 as it is to output the PWM output signal PWMout, the configuration of the clipping state detecting circuit can be simplified.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A clipping state detecting circuit comprising:
   a zero-cross detection circuit that detects a zero-cross point of an input signal and outputs a zero-cross signal;
   an output circuit that converts the input signal into a pulse width modulation (PWM) signal;
   a clip detection circuit that detects a state in which an output of the output circuit is clipped and outputs a clip detection signal; and
   a control circuit that determines that a state is a clipping state when a clip time in which the output of the output circuit is clipped satisfies a condition of a threshold value set in advance with respect to a non-clip time from a point in time at which the zero-cross signal is output to a point in time at which the clip detection signal is output.

2. The clipping state detecting circuit according to claim 1, wherein
   the output circuit is a class D amplifier that outputs the PWM signal in response to the input signal.

3. The clipping state detecting circuit according to claim 1, wherein
   the input signal is an analog signal,
   a clock generation circuit that outputs a reference clock signal is included, and
   the output circuit is a class D amplifier that outputs the PWM signal in response to the input signal and the reference clock signal.

4. The clipping state detecting circuit according to claim 3, further comprising:
   a first counter that measures the non-clip time in response to the zero-cross signal and the reference clock signal; and
   a second counter that measures the clip time in response to the clip detection signal and the reference clock signal.

5. The clipping state detecting circuit according to claim 4, wherein
   the clock generation circuit outputs a first reference clock signal and a second reference clock signal having a higher frequency than the first reference clock signal,
   the class D amplifier generates the PWM signal in response to the input signal and the first reference clock signal,
   the first counter measures the non-clip time in response to the zero-cross signal and the second reference clock signal, and
   the second counter measures the clip time in response to the clip detection signal and the second reference clock signal.

6. The clipping state detecting circuit according to claim 1, further comprising:
   a clock generation circuit that outputs a first reference clock signal and a second reference clock signal having a higher frequency than the first reference clock signal;
   a first counter that measures the non-clip time in response to the zero-cross signal and the second reference clock signal; and
   a second counter that measures the clip time in response to the clip detection signal and the second reference clock signal.

7. The clipping state detecting circuit according to claim 6, wherein
   the output circuit is a class D amplifier that outputs the PWM signal in response to the input signal and the first reference clock signal.

8. The clipping state detecting circuit according to claim 1, wherein
   the condition of the threshold value is set by a ratio of the clip time to the non-clip time.

9. The clipping state detecting circuit according to claim 1, wherein the condition of the threshold is set by a value obtained by multiplying the non-clip time by a preset ratio.

10. The clipping state detecting circuit according to claim 9, wherein the preset ratio is a value associated with a distortion ratio.

11. The clipping state detecting circuit according to claim 10, wherein
    the distortion ratio is set by being associated with a value obtained by dividing the clip time by a value obtained by adding a time twice the non-clip time to the clip time.

12. The clipping state detecting circuit according to claim 1, further comprising:
    a DA conversion circuit that converts a digital signal into an analog signal, wherein
    the input signal is the digital signal, and
    the zero-cross detection circuit detects a zero-cross point of an output of the DA conversion circuit.

13. The clipping state detecting circuit according to claim 12, further comprising a signal processing circuit that performs predetermined signal processing on the input signal and outputs the processed signal to the DA conversion circuit.

14. The clipping state detecting circuit according to claim 1, wherein
    the input signal is a digital signal having a signal format expressed by two's complement, and
    the zero-cross detection circuit includes a sign inversion detection circuit that detects inversion of data indicating a sign of the input signal.

15. The clipping state detecting circuit according to claim 14, further comprising a delay time adjustment circuit that delays an output signal of the sign inversion detection circuit.

16. A clipping state detecting method for detecting a clipping state of a pulse width modulation (PWM) output signal output from a PWM signal output circuit in response to an input signal, the clipping state detecting method comprising:
  receiving the input signal;
  detecting a zero-cross point of the input signal;
  converting the input signal into a PWM signal;
  detecting a state in which the PWM signal is clipped;
  counting a clip time in the state in which the PWM signal is clipped;
  counting a non-clip time from the zero-cross point to a point in time at which the clip detection signal is output; and
  determining that a state is a clipping state when the clip time satisfies a condition of a threshold value set in advance with respect to the non-clip time.

17. The clipping state detecting method according to claim 16, wherein
  the receiving of the input signal includes receiving a digital input signal, and
  the detecting of the zero-cross point includes
    converting the digital input signal into an analog signal, and
    detecting the zero-cross point of the analog signal.

18. The clipping state detecting method according to claim 16, wherein
  the receiving of the input signal includes receiving a digital signal having a signal format expressed by two's complement, and
  the detecting of the zero-cross point includes detecting that data indicating a sign of the input signal is inverted.

19. The clipping state detecting method according to claim 16, wherein
  the receiving of the input signal includes receiving an analog signal, and
  the detecting of the zero-cross point includes detecting a point at which the input signal changes up and down around a reference level.

20. The clipping state detecting method according to claim 16, wherein
  the determining that a state is the clipping state includes detecting that the clip time becomes a value set by a value obtained by multiplying the non-clip time by a preset ratio.

* * * * *